US012124662B2

(12) United States Patent
Lee et al.

(10) Patent No.: US 12,124,662 B2
(45) Date of Patent: Oct. 22, 2024

(54) DISPLAY APPARATUS

(71) Applicant: LG Display Co., Ltd., Seoul (KR)

(72) Inventors: Geonwoo Lee, Anyang-si (KR); Geon Jang, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/078,703

(22) Filed: Dec. 9, 2022

(65) Prior Publication Data

US 2023/0214079 A1 Jul. 6, 2023

(30) Foreign Application Priority Data

Dec. 30, 2021 (KR) .......................... 10-2021-0192381

(51) Int. Cl.
*G06F 3/044* (2006.01)
*H10K 59/40* (2023.01)

(52) U.S. Cl.
CPC ........... *G06F 3/0446* (2019.05); *H10K 59/40* (2023.02); *G06F 2203/04112* (2013.01)

(58) Field of Classification Search
CPC ........ G06F 3/0446; G06F 2203/04112; G06F 3/04164; G06F 3/0412; G06F 3/0443; G06F 2203/04111; H10K 59/40
See application file for complete search history.

(56) References Cited

U.S. PATENT DOCUMENTS

| | | |
|---|---|---|
| 2015/0009422 A1 | 1/2015 | Tung |
| 2015/0115297 A1* | 4/2015 | Lee .................... H10K 59/8722 257/89 |
| 2015/0255518 A1 | 9/2015 | Wantanabe et al. |
| 2017/0308192 A1* | 10/2017 | Ogura ................. G06F 3/04164 |
| 2018/0321764 A1 | 11/2018 | Oh |
| 2019/0036063 A1 | 1/2019 | Lee et al. |
| 2019/0131375 A1 | 5/2019 | Kim et al. |
| 2020/0083299 A1* | 3/2020 | Kim ..................... G06F 3/04164 |
| 2020/0110498 A1* | 4/2020 | Lee ........................ G06F 3/0412 |
| 2020/0159383 A1* | 5/2020 | Jeong .................. G06F 3/04164 |
| 2021/0141479 A1 | 5/2021 | Lee et al. |

(Continued)

FOREIGN PATENT DOCUMENTS

| | | |
|---|---|---|
| CN | 110888249 A | 3/2020 |
| CN | 112860095 A | 5/2021 |

(Continued)

OTHER PUBLICATIONS

Extended European Search Report issued in corresponding European Patent Application No. 22209584.6, dated May 9, 2023.

(Continued)

*Primary Examiner* — Amy Onyekaba
(74) *Attorney, Agent, or Firm* — Morgan, Lewis & Bockius LLP

(57) ABSTRACT

A display apparatus includes a substrate having an active area and a non-active area adjacent to the active area defined thereon; a first touch line in the non-active area and a second touch line on the first touch line; and a front member on the first and second touch lines, the front member being in at least a part of the non-active area, and including a transmissive part and a blocking part, wherein the first touch line is in an area overlapping the transmissive part, and the first touch lines includes at least two patterns.

23 Claims, 12 Drawing Sheets

(56) References Cited

U.S. PATENT DOCUMENTS

| | | | |
|---|---|---|---|
| 2021/0200386 A1* | 7/2021 | Park | G06F 3/0412 |
| 2021/0200407 A1* | 7/2021 | Jang | G06F 3/04164 |
| 2021/0335983 A1 | 10/2021 | Feng et al. | |
| 2023/0132929 A1* | 5/2023 | Kwon | G06F 3/0412 |
| | | | 345/204 |
| 2023/0147261 A1* | 5/2023 | Zhang | G09F 9/30 |
| | | | 345/173 |

FOREIGN PATENT DOCUMENTS

| | | |
|---|---|---|
| JP | 2013-214185 A | 10/2013 |
| JP | 2020-042806 A | 3/2020 |
| JP | 2021-157183 A | 10/2021 |
| JP | 2021-532433 A | 11/2021 |
| KR | 10-2017-0065921 A | 6/2017 |
| KR | 10-2018-0123292 A | 11/2018 |
| KR | 10-2019-0047755 A | 5/2019 |
| TW | I485598 B | 5/2015 |
| TW | I667604 B | 8/2019 |

OTHER PUBLICATIONS

Office Action issued Aug. 31, 2023, by the Taiwanese Patent Office corresponding to TW Patent Application No. 111148507.
Office Action issued in corresponding JP application 2022-203945 dated Dec. 26, 2023 with machine translation.
Office Action issued in corresponding TW application 111148507 dated Jan. 23, 2024 with machine translation.

\* cited by examiner

DISPLAY APPARATUS

CROSS-REFERENCE TO RELATED APPLICATIONS

This application claims the priority of Korean Patent Application No. 10-2021-0192381 filed on Dec. 30, 2021, in the Korean Intellectual Property Office, the disclosure of which is incorporated herein by reference.

BACKGROUND

Technical Field

The present disclosure relates to a display apparatus, and more particularly, to a display apparatus which provides a uniform contrast ratio to the display apparatus.

Discussion of the Related Art

Recently, as it enters an information era, display technology to visually express electrical information signals has rapidly developed, and in response to this, various display apparatuses having excellent performances, such as thin profile, low weight, and low power consumption have been developed. Specific examples of the display apparatus may include a liquid crystal display apparatus (LCD), an organic light emitting display apparatus (OLED), and a quantum dot display apparatus. To provide more various functions to users, as the display apparatus, a touch display apparatus having a touch based input method for users to intuitively and easily input information or instructions by breaking away from the usual input methods, such as a button, a keyboard, or a mouse is being studied.

The display apparatus may include a plurality of touch electrodes which is disposed on the display panel or embedded in the display panel. Further, the display apparatus may detect the presence of touch or the touch coordinate based on the change in the capacitance formed in the plurality of touch lines formed on a substrate by the touch of the user.

The touch electrode included in the display panel is electrically connected to a touch driving circuit by the touch line and is driven. The touch electrode is disposed in the active area in which the image is displayed and the touch line is disposed in the non-active area in the display panel in which the image is not displayed.

The touch electrode and the touch line may be configured using an opaque conductive material. When the touch electrode disposed in the active area is formed of an opaque conductive material, light emitted from the plurality of sub pixels disposed below the touch electrode is blocked so as not to be transmitted to the upper portion so that the touch electrode may be disposed in a non-emission area disposed between the sub pixels in the active area. Accordingly, the touch electrode may be designed to have a small line width so as to be disposed in the non-emission area between the sub pixels disposed in the active area.

The touch line disposed in the non-active area may electrically connect the touch driving circuit and the touch electrode to transmit a signal from the touch driving circuit to the touch electrode. When the number of touch lines and the length of the touch line are increased to transmit the signal of the touch driving circuit disposed in a part of the non-active area to the touch electrode, there may be a problem in that the resistance of the touch line or RC delay is increased. Therefore, the touch line needs to be designed with a width larger than that of the touch electrode in the active area to reduce the resistance of the touch line or the RC delay.

When the display apparatus does not operate, external light may be incident into the display apparatus. The external light incident into the display apparatus is reflected by various metal electrodes and wiring lines formed in the display apparatus.

Light reflected by the metal electrode and the wiring line in the display apparatus may be transmitted to the outside again. When the reflected light is transmitted, reflected light may not be transmitted to the outside of the display apparatus, but may be blocked, by the touch electrode and the touch line disposed in an upper portion of the display apparatus. The touch line in the non-active area is formed thicker than the touch electrode in the active area so that an amount of reflected light transmitted to the outside may be smaller than that of the surrounding area. By doing this, when the user watches the display apparatus, there is a problem in that an area in which the touch line is formed appears darker than the surround area.

Accordingly, improved reliability of the product to improve the contrast ratio difference in a partial non-active area of the display apparatus may be desired.

Various studies are being made to reduce the contrast ratio difference generated when the display apparatus does not operate, but it is still insufficient so that development thereof is urgently required.

SUMMARY

Accordingly, embodiments of the present disclosure are directed to a display apparatus that substantially obviates one or more of the problems due to limitations and disadvantages of the related art.

An aspect of the present disclosure is to provide a display apparatus which includes a pattern in a touch line to improve a non-uniform contrast ratio of the display apparatus which is visible to the user when the display apparatus does not operate.

Another aspect of the present disclosure is to provide a display apparatus which provides a uniform contrast ratio of the display apparatus by increasing an amount of light which is transmitted to the outside by scattering light incident from the outside by a pattern of the touch line.

Still another aspect of the present disclosure is to provide a display apparatus in which a contrast ratio of the display apparatus is configured to be uniform, thereby improving the reliability of the product.

Still another aspect of the present disclosure is to provide a display apparatus having a high aesthetic sense by configuring the contrast ratio to be uniform.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a display apparatus display apparatus includes a substrate having an active area and a non-active area adjacent to the active area defined thereon; a first touch line in the non-active area and a second touch line on the first touch line; and a front member on the first and second touch lines, the front member being in at least a part of the non-active area, and including a transmissive part and a blocking part, wherein the first touch line is in an area overlapping the transmissive part, and the first touch lines includes at least two patterns.

In another aspect, a display apparatus, comprises a substrate that having an active area and a non-active area adjacent to the active area defined thereon; a first touch electrode in the active area; a second touch electrode on the first touch electrode; a first touch line in the non-active area; a second touch line on the first touch line; and a front member on the first touch electrode, the second touch electrode, the first touch line, and the second touch line, the front member being in at least a part of the non-active area, and including a transmissive part and a blocking part, wherein the first touch line is in an area overlapping the transmissive part in at least a part of the non-active area, and the first touch line includes at least two patterns.

In another aspect, a display apparatus comprises a substrate having an active area and a non-active area adjacent to the active area defined thereon; a first touch line in the non-active area and a second touch line on the first touch line; and a front member on the first and second touch lines, the front member being in at least a part of the non-active area, and including a transmissive part and a blocking part, wherein the second touch line in the transmissive part of the non-active area includes an uneven lower surface.

Other detailed matters of the exemplary embodiments are included in the detailed description and the drawings.

According to the exemplary embodiment of the present disclosure, the display apparatus includes a pattern in the touch line so that a problem in that a non-uniform contrast ratio is visible to the user when the display apparatus does not operate may be solved.

In the display apparatus according to the exemplary embodiment of the present disclosure, the pattern of the touch line scatters the light incident from the outside to increase the amount of light which is transmitted to the outside so that the non-uniform contrast of the display apparatus may be solved.

According to the exemplary embodiment of the present disclosure, in the display apparatus, the contras ratio is uniformly formed to improve the product reliability.

According to the exemplary embodiment of the present disclosure, in the display apparatus, the non-uniform contrast ratio of the display apparatus is reduced so as not to be exposed to the sights of the users so that the contrast ratio of the display apparatus is uniformly formed to provide a high aesthetic sense to the user.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
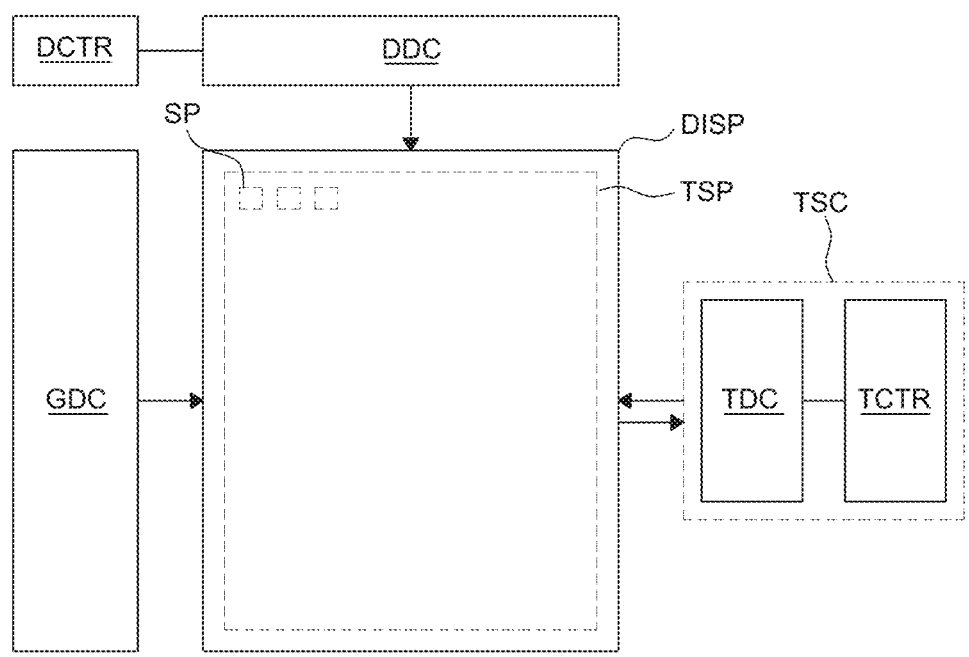
FIG. 1 is a view illustrating a display apparatus according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

In the present disclosure, "apparatus" may include a display apparatus which includes a display panel and a driver for driving the display panel, such as a liquid crystal module (LCM) or an organic light emitting display module (OLED module). Further, the "apparatus" may further include a set electronic device or a set device (or a set apparatus) which is a complete product or a final product including an LCM, or an OLED module, such as a notebook computer, a television, or a computer monitor, an automotive display or equipment display including another type of vehicle and a mobile electronic device including a smart phone or an electronic pad.

Accordingly, the apparatus of the present disclosure may include not only a display apparatus itself such as an LCM, an OLED module, or a QD module, but also an applied product or a set apparatus which is a final consumer device including the LCM or the OLED module.

In some exemplary embodiments, the LCM or the OLED module configured by the display panel and the driver is represented as a "display apparatus" and an electronic apparatus as a complete product including the LCM or the OLED module is represented as a "set apparatus". For example, the display apparatus may include a liquid crystal (LCD) or an organic light emitting (OLED) display panel and a source PCB which is a controller for driving the display panel. The set apparatus may further include a set PCB as a set controller which is electrically connected to the source PCB to drive the entire set apparatus.

As the display panel used in the exemplary embodiment of the present disclosure, any type of display panel such as a liquid crystal display panel, an organic light emitting diode (OLED) display panel, and an electroluminescent display panel may be used, but the exemplary embodiment is not limited thereto. For example, the display panel may be a display panel which is vibrated by a vibrating device according to an exemplary embodiment of the present disclosure to generate a sound. The display panel applied to the display apparatus according to the exemplary embodiment of the present disclosure is not limited to a shape or a size of the display panel.

Hereinafter, a display apparatus according to exemplary embodiments of the present disclosure will be described in detail with reference to accompanying drawings.

FIG. 1 is a view illustrating a display apparatus according to an exemplary embodiment of the present disclosure.

With reference to FIG. 1, the display apparatus according to the exemplary embodiment of the present disclosure provides a function for image display and a function for touch sensing.

Hereinafter, even though the description will be made under the assumption that the light emitting display apparatus is the organic light emitting display apparatus, the type of the light emitting diode layer is not limited thereto.

To provide an image displaying function, the display apparatus according to exemplary embodiments of the present disclosure may include a display panel DISP, a data driving circuit DDC, a gate driving circuit GDC, and a display controller DCTR. In the display panel DISP, a plurality of data lines and a plurality of gate lines are disposed and a plurality of sub pixels SP defined by the plurality of data lines and the plurality of gate lines is disposed. The data driving circuit DDC drives the plurality of data lines and the gate driving circuit GDC drives the plurality of gate lines. The display controller DCTR controls operations of the data driving circuit DDC and the gate driving circuit GDC.

Each of the data driving circuit DDC, the gate driving circuit GDC, and the display controller DCTR may be implemented by one or more individual components. For example, two or more of the data driving circuit DDC, the gate driving circuit GDC, and the display controller DCTR may be implemented to be combined as one component. For example, the data driving circuit DDC and the display controller DCTR may be implemented as one integrated chip (IC chip).

To provide a touch sensing function, the display apparatus according to exemplary embodiments of the present disclosure may include a touch panel TSP and a touch sensing circuit TSC. The touch panel TSP includes a plurality of touch electrodes. The touch sensing circuit TSC supplies a touch driving signal to the touch panel TSP and detects a touch sensing signal from the touch panel TSP to sense the presence of a touch of a user or a touch position (touch coordinate) in the touch panel TSP based on the detected touch sensing signal.

The touch sensing circuit TSC may include a touch driving circuit TDC and a touch controller TCTR. The touch driving circuit TDC supplies a touch driving signal to the touch panel TSP and detects a touch sensing signal from the touch panel TSP. The touch controller TCTR senses the presence of a touch of a user and/or a touch position in the touch panel TSP based on the touch sensing signal detected by the touch driving circuit TDC.

The touch driving circuit TDC may include a first circuit part which supplies the touch driving signal to the touch panel TSP and a second circuit part which detects the touch sensing signal from the touch panel TSP. The touch driving circuit TDC and the touch controller TCTR may be implemented by separate components or may be implemented to be combined as one component.

Each of the data driving circuit DDC, the gate driving circuit GDC, and the touch driving circuit TDC may be implemented by one or more integrated circuits. From the viewpoint of electrical connection with the display panel DISP, the circuits may be implemented by a chip on glass (COG) type, a chip on film (COF) type, or a tape carrier package (TCP) type. Further, the gate driving circuit GDC may also be implemented by a gate in panel (GIP) type.

Each of circuit configurations DDC, GDC, and DCTR for display driving and circuit configurations TDC and TCTR for touch sensing may be implemented by one or more individual components. For example, one or more of circuit configurations DDC, GDC, and DCTR for display driving and one or more of circuit configurations TDC and TCTR for touch sensing are functionally integrated to be implemented by one or more components.

The data driving circuit DDC and the touch driving circuit TDC may be implemented to be integrated in one or two or more integrated circuit chips. When the data driving circuit DDC and the touch driving circuit TDC are implemented to be integrated in two or more integrated circuit chips, each of two or more integrated circuit chips may have a data driving function and a touch driving function.

The touch panel TSP may include a plurality of touch electrodes which is applied with a touch driving signal or detects a touch sensing signal therefrom and a plurality of touch lines which connects the plurality of touch electrodes to the touch driving circuit TDC. The touch panel TSP may be disposed at the outside of the display panel DISP. For example, the touch panel TSP and the display panel DISP may be separately manufactured to be combined. Such a touch panel TSP is called an external type or an add-on type, but is not limited to this terminology.

The touch panel TSP may be embedded in the display panel DISP. That is, when the display panel DISP is manufactured, a touch sensor structure such as a plurality of touch electrodes and a plurality of touch lines which configure a touch panel TSP may be formed together with electrodes and signal lines for display driving. Such a touch panel TSP is called an embedded type, but is not limited to this terminology. Hereinafter, it is assumed that the touch panel TSP is an embedded type, but the touch panel TSP is not limited thereto.

Figure 2:
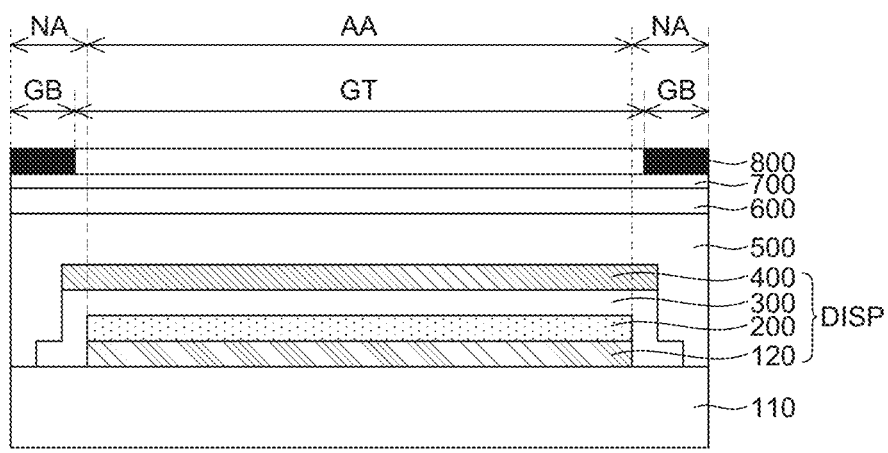
FIG. 2 is a cross-sectional view of a display apparatus according to an exemplary embodiment of the present disclosure.
Figure 3:
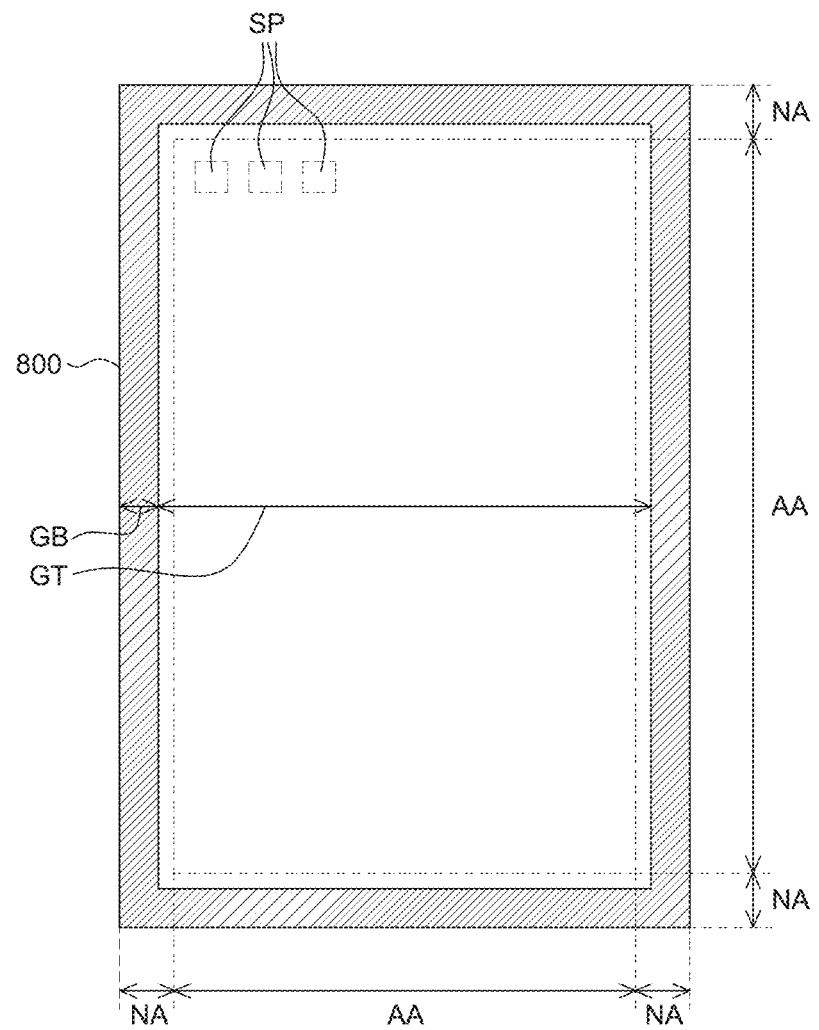
FIG. 3 is a plan view of a display apparatus according to an exemplary embodiment of the present disclosure.

FIG. 2 is a cross-sectional view of a display apparatus according to an exemplary embodiment of the present disclosure. FIG. 3 is a plan view of a display apparatus according to an exemplary embodiment of the present disclosure.

With reference to FIGS. 2 and 3, the display apparatus 100 according to the exemplary embodiment of the present disclosure may include a substrate including an active area AA and a non-active area NA and a front member 800 including a transmissive part GT and a blocking part GB.

The substrate 110 according to the exemplary embodiment of the present disclosure may include an active area AA and a non-active area NA which encloses the active area. The non-active area NA of the substrate 110 is adjacent to the active area AA and disposed in the outside from the active area AA.

The active area AA is an area where a plurality of sub pixels SP is disposed to display images. Each of the plurality of sub pixels SP may be an individual unit which emits light and each sub pixel SP emits red light, green light, blue light, or white light, but is not limited thereto.

The active area AA may include an organic light emitting diode. In each of the plurality of sub pixels SP, a thin film transistor and a light emitting diode layer may be disposed. For example, in the plurality of sub pixels SP, a display element for displaying images and a circuit unit for driving the display element may be disposed.

The non-active area NA is an area where no image is displayed and various wiring lines and driving circuits for driving the plurality of sub pixels SP disposed in the active area AA are disposed. For example, in the non-active area NA, various Integrated Circuits (IC) such as a gate driver IC and a data driver IC and driving circuits may be disposed. The non-active area NA may be a bezel area, but is not limited to the terminology.

The non-active area NA may be disposed in the vicinity of the active area AA as illustrated in FIGS. 2 and 3. For example, the non-active area NA is an area which encloses the active area AA. The non-active area NA may be an area extending from the active area AA. Alternatively, the non-active area NA may be an area in which a plurality of sub pixels SP is not disposed, but is not limited thereto.

Even though in FIGS. 2 and 3, it is illustrated that the non-active area NA encloses a quadrangular active area AA, a shape of the active area AA and a shape and placement of the non-active area NA adjacent to the active area AA are not limited to the example illustrated in FIGS. 2 and 3. The active area AA and the non-active area NA may have shapes suitable for a design of an electronic device including the display apparatus 100. In the case of a display apparatus which is wearable by a user may have a circular shape such as a normal watch and the exemplary embodiments of the present disclosure may also be applied to a free-form display apparatus which is applicable to a vehicle dashboard. An exemplary shape of the active area AA may be a pentagon, a hexagon, a circle, or an oval, but is not limited thereto.

In the active area AA of the substrate 110, a plurality of touch electrodes for touch sensing and a plurality of touch connection electrodes which is electrically connected to the plurality of touch electrodes may be disposed. The active area AA may also be referred to as a touch sensing area. The active area AA is capable of sensing the touch.

The substrate 110 may support various components of the display apparatus. The substrate 110 may be formed of a plastic material having a flexibility. For example, the substrate 110 may be formed of polyimide (PI). When the substrate 110 is formed of polyimide (PI), the manufacturing process of the display apparatus is performed under a state in which a support substrate formed of glass is disposed below the substrate 110 and the support substrate may be released after completing the manufacturing process of the display apparatus. Further, after releasing the support substrate, a back plate (or plate) which supports the substrate 110 may be disposed below the substrate 110.

When the substrate 110 is formed of polyimide, a moisture component permeates the substrate 110 formed of polyimide so that moisture permeation proceeds to the thin film transistor or the light emitting diode layer to degrade the performance of the display apparatus. In order to suppress the degradation of the performance of the display apparatus due to the moisture permeation, the display apparatus according to the exemplary embodiment of the present disclosure may be configured by two polyimides. Further, an inorganic layer is formed between two polyimides (PI) to block the moisture components from permeating the lower polyimide (PI), so that the performance reliability of the product may be improved. The inorganic layer may be formed by a single layer of silicon nitride (SiNx) or silicon oxide (SiOx) or a multilayer thereof, but is not limited thereto.

The substrate 110 is referred to as a concept including elements and functional layers formed on the substrate 110, such as a switching element, a thin film transistor connected to the switching element, an organic light emitting diode connected to the thin film transistor, and a protection layer. However, it is not limited thereto.

The display panel DISP may be disposed on the substrate 110. The display panel DISP is a panel in which images are implemented. Display elements for implementing images, and wiring lines, driving circuits, and various components for driving the display elements may be disposed in the display panel.

In the display panel DISP, a plurality of pixels SP is disposed in a matrix to display images. Further, the display panel DISP may include a plurality of touch electrodes embedded in the display panel DISP. Accordingly, the presence of touch or the touch coordinate may be detected based on the change in the capacitance formed on a plurality of touch electrodes by the touch of the user.

The display panel DISP may include a thin film transistor 120, a light emitting diode layer 200, a protection layer 300, and a touch sensor layer 400. The thin film transistor 120, the light emitting diode layer 200, the protection layer 300, and the touch sensor layer 400 will be described below with reference to FIG. 6.

A polarizer 600 may be disposed on the touch sensor layer 400. The polarizer 600 selectively transmits light to reduce the reflection of external light which is incident onto the display apparatus. For example, the display panel DISP may include various metal materials which are applied to the thin film transistor 120, the light emitting diode layer 200, and the wiring line. Therefore, the external light incident onto the display apparatus may be reflected from the metal material so that the visibility of the display apparatus 100 may be reduced due to the reflection of the external light. Therefore, the polarizer 600 is disposed on one surface of the display apparatus 100 to suppress the reflection of the external light and increase an outdoor visibility of the display apparatus 100. However, the components of the display apparatus 100 illustrated in FIG. 2 are illustrative and the polarizer 600 may be omitted depending on the structure of the display apparatus 100.

A first adhesive layer 500 is formed between the touch sensor layer 400 and the polarizer 600 to dispose the polarizer 600 on the touch sensor layer 400 to be bonded. The first adhesive layer 500 may be formed of a material having adhesiveness and for example, may be formed of an optically clear adhesive (OCA) or a pressure sensitive adhesive (PSA), but is not limited thereto.

The front member 800 is disposed on the polarizer 600. The front member 800 may protect the polarizer 600 and the display panel DISP disposed below the front member 800 from external impact, moisture, and heat. The front member 110 may be formed of a material having an impact resistance and optical transmittance. For example, the front member 110 may be a substrate formed of glass or a film formed of a plastic material such as polymethylmethacrylate (PMMA), polyimide (PI), or polyethylene terephthalate (PET), but is not limited thereto. Further, the front member 800 is an exemplary terminology, and may be referred to as various terminologies, such as a cover window, a window cover, or a cover glass, but is not limited thereto.

The front member 800 may include a transmissive part GT and a blocking part GB. The blocking part GB of the front member 800 may be formed to enclose the transmissive part GT of the front member 800.

The transmissive part GT of the front member 800 may overlap the active area AA and a part of the non-active area NA. The transmissive part GT of the front member 800 may be formed to be transparent so that light emitted from the display panel DISP including the light emitting diode layer 200 is transmitted to the outside of the display apparatus 100 and the image provided by the display apparatus 100 is visible to the user.

The blocking part GB of the front member 800 overlaps a part of the non-active area NA adjacent to the active area AA. The blocking part GB of the front member 800 may be formed to be opaque so that the wiring line, the driving circuit, and various components formed below the front member 800 in the display apparatus 100 are not visible to the user.

The blocking part GB may include a light shielding material such as a pigment, a dye, and carbon black. For example, the blocking part GB may be coated with the black ink. The blocking part GB is formed at an edge of the rear surface of the front member 800 as a separate component to be attached to the front member 800.

The front member 800 may include a transmissive part GT in an area overlapping the active area AA. The front member 800 may include the transmissive part GT and the blocking part GB in an area overlapping the non-active area NA.

The front member 800 may be bonded to the substrate 110 in which the display panel DISP is disposed by the bonding process after completing the manufacturing process of the display panel DISP on the substrate 110.

When the transmissive part GT and the blocking part GB of the front member 800 are misaligned with the active area AA and the non-active area NA of the substrate 110 during the bonding process, the blocking part GB of the front member 800 may hide a part of the active area AA of the substrate 110. When the blocking part GB of the front member 800 partially overlaps the active area AA, there may be a problem in that a size of the active area AA in which the image is displayed is reduced. The transmissive part GT of the front member 800 needs to be formed in a part of the non-active area NA adjacent to the active area AA. For example, the blocking part GB of the front member 800 needs to be disposed to be spaced apart from the active area AA so as not to overlap the active area AA of the substrate 110.

A part of the touch line disposed in the non-active area NA is not hidden by the blocking part GB formed in the front member 800, but may be exposed by the transmissive part GB of the front member 800. For example, a part of the touch line may be disposed in an area overlapping the transmissive part of the front member.

The touch line formed in the non-active area NA will be described below with reference to FIG. 5.

The second adhesive layer 700 is formed between the polarizer 600 and the front member 800 to bond the front member 800 onto the polarizer 600. The second adhesive layer 700 may be formed of a material having adhesiveness and for example, may be formed of an optically clear adhesive (OCA) or a pressure sensitive adhesive (PSA), but is not limited thereto.

Figure 4:
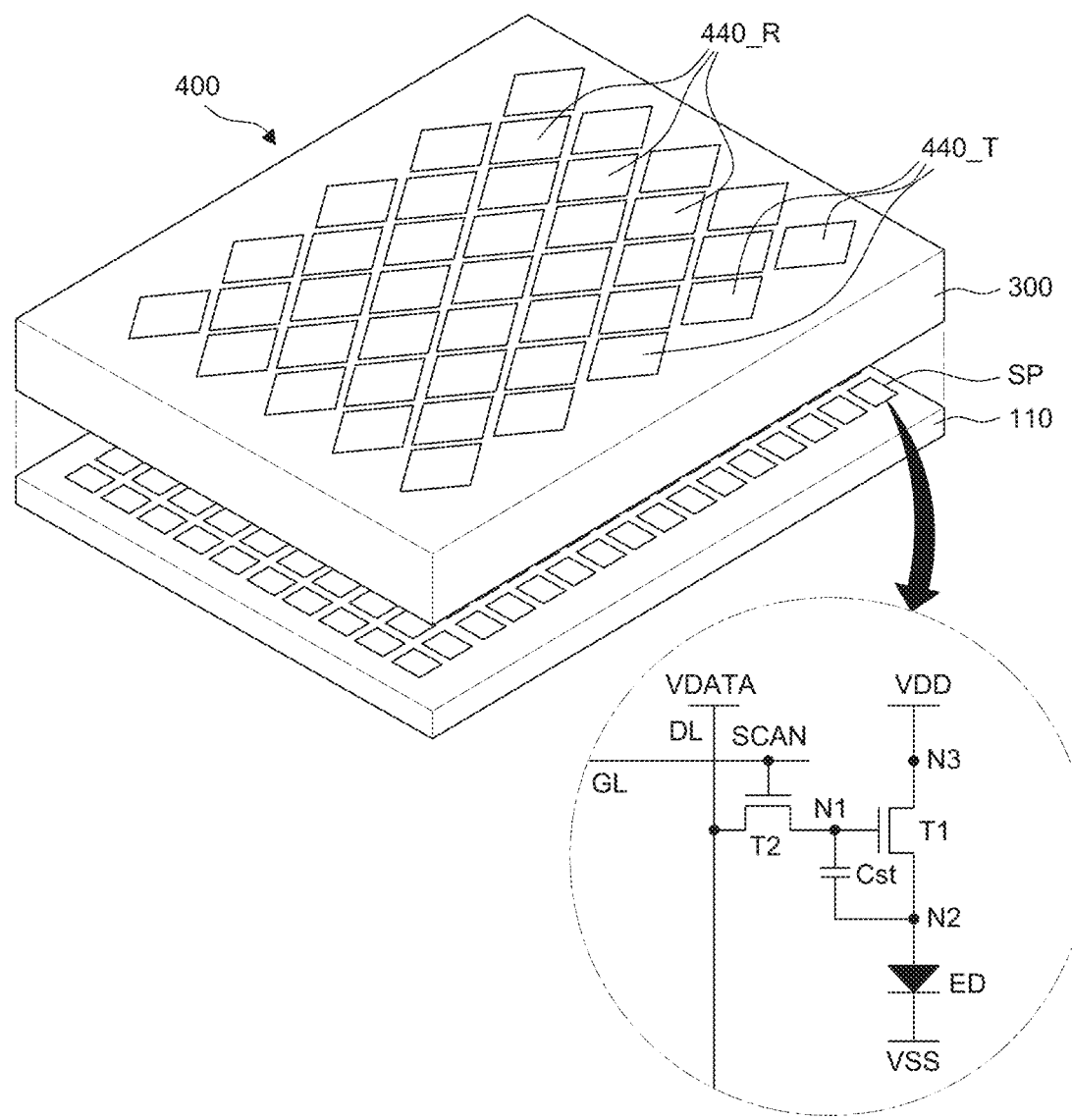
FIG. 4 is a view illustrating a touch sensor layer embedded in a display apparatus according to an exemplary embodiment of the present disclosure.

FIG. 4 is a view illustrating a touch sensor layer embedded in a display apparatus according to an exemplary embodiment of the present disclosure.

With reference to FIG. 4, in the active area AA of the display panel DISP, a plurality of sub pixels SP is disposed on the substrate 110.

Each sub pixel SP may include a light emitting diode ED, a first transistor T1 for driving the light emitting diode ED, a second transistor T2 for transmitting a data voltage VDATA to a first node N1 of the first transistor T1, and a storage capacitor Cst for maintaining a constant voltage for one frame.

The first transistor T1 may include a first node N1 to which the data voltage VDATA is applied, a second node N2 which is electrically connected to the light emitting diode ED, and a third node N3 to which a driving voltage VDD is applied from a driving voltage line. The first node N1 is a gate node, the second node N2 is a source node or a drain node, and the third node N3 is a drain node or a source node.

The first transistor T1 may also be referred to as a driving transistor which drives the light emitting diode ED.

The light emitting diode ED may include an anode electrode, an emission layer, and a cathode electrode. The anode electrode is electrically connected to the second node N2 of the first transistor T1 and the cathode electrode may be applied with a ground voltage VSS.

The emission layer in the light emitting diode ED may be an organic emission layer including an organic material. In this case, the light emitting diode ED may be an organic light emitting diode (OLED).

The second transistor T2 is controlled to be turned on or off by a scan signal SCAN applied through the gate line GL and is electrically connected between the first node N1 of the first transistor T1 and the data line DL. The second transistor T2 may be referred to as a switching transistor.

When the second transistor T2 is turned on by the scan signal SCAN, the second transistor T2 transmits the data voltage VDATA supplied from the data line DL to the first node N1 of the first transistor T1.

The storage capacitor Cst may be electrically connected between the first node N1 and the second node N2 of the first transistor T1.

Each sub pixel SP may have a 2T1C structure including two transistors T1 and T2 and one capacitor Cst and in some cases, may further include one or more transistors or further include one or more capacitors.

The storage capacitor Cst may be an external capacitor which is designed at the outside of the first transistor T1, rather than a parasitic capacitor (for example, Cgs or Cgd) which is an internal capacitor formed between the first node N1 and the second node N2 of the first transistor T1.

Each of the first transistor T1 and the second transistor T2 may be an n-type transistor or a p-type transistor.

As described above, in the display panel DISP, circuit elements such as a light emitting diode ED, two or more transistors T1 and T2, and one or more capacitors Cst are disposed. The circuit element (specifically, a light emitting diode ED) is vulnerable to moisture or oxygen from the outside. Therefore, a protection layer 300 may be disposed in the display panel DISP to suppress the permeation of the moisture or oxygen from the outside into the circuit element (specifically, the light emitting diode ED). The protection layer 300 may be formed as a single layer, but may also be disposed as multiple layers.

In the display apparatus according to the exemplary embodiments of the present disclosure, the touch sensor layer 400 may be formed on the protection layer 300. The touch sensor layer 400 may include a first touch electrode 440_R and a second touch electrode 440_T.

During the touch sensing, a touch driving signal or a touch sensing signal may be applied to the first touch electrode 440_R and the second touch electrode 440_T. Accordingly, during the touch sensing, a potential difference is formed between the first touch electrode 440_R and the second touch electrode 440_T and the cathode electrode which are disposed with the protection layer 300 therebetween so that a redundant parasitic capacitance may be formed. Such a parasitic capacitance may degrade a touch sensitivity. Therefore, in order to lower the parasitic capacitance, a distance between the first touch electrode 440_R and the second touch electrode 440_T and the cathode electrode may be designed to be larger than a predetermined value (for example, 1 μm or larger) in consideration of a panel thickness, a panel manufacturing process, and a display performance.

Figure 5:
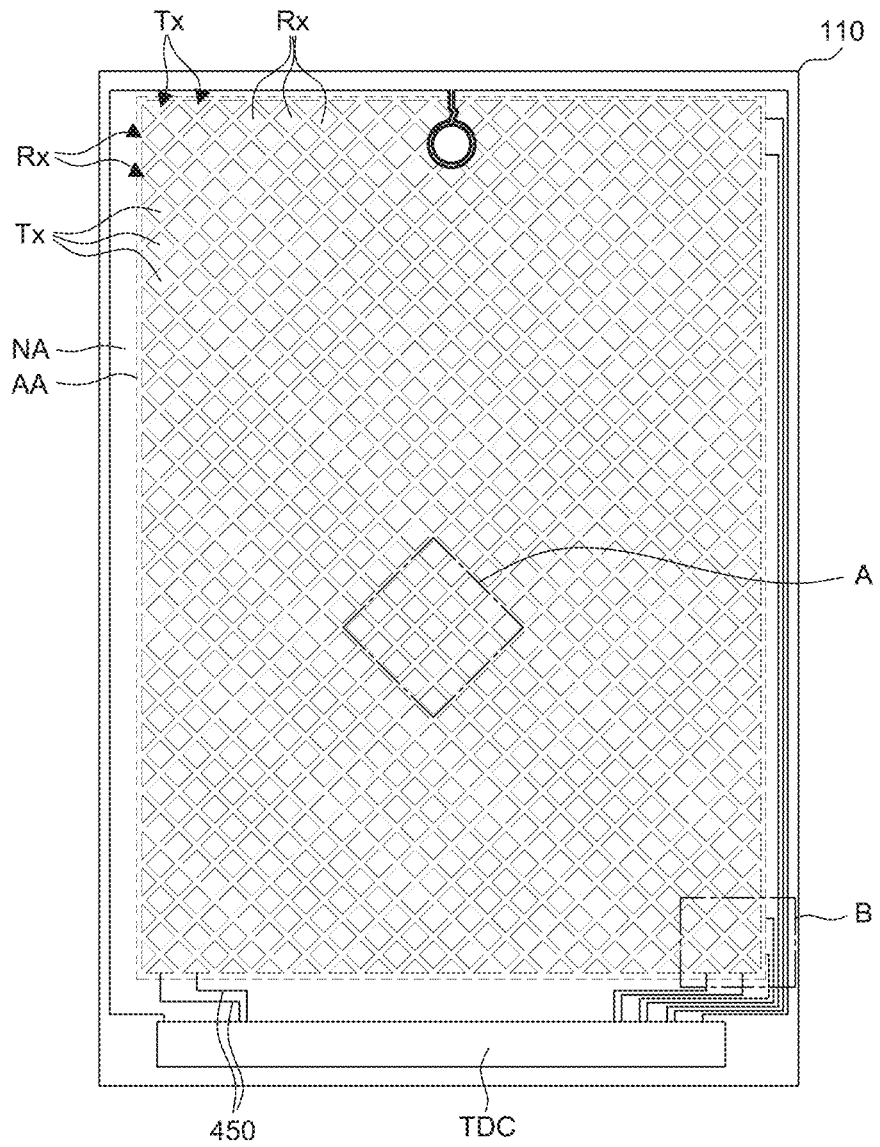
FIG. 5 is a plan view illustrating a touch sensor layer disposed on a substrate according to an exemplary embodiment of the present disclosure.

FIG. 5 is a plan view illustrating a touch sensor layer disposed on a substrate according to an exemplary embodiment of the present disclosure.

With reference to FIG. 5, in the active area AA of the display apparatus 100, at least one first touch block Rx and second touch block Tx may be disposed.

The first touch block Rx includes at least one first touch electrode 440_R and at least one first touch connection electrode 420. The second touch block Tx includes at least one second touch electrode 440_T and at least one second touch connection electrode 440_C. The first touch block Rx and the second touch block Tx may have a metal mesh structure, but are not limited thereto.

At least one first touch block Rx extends along a first direction (or an X-axis direction). The first touch block Rx may include at least one first touch electrode 440_R which is disposed to have a predetermined interval.

At least one first touch electrode 440_R may be electrically connected to each other in the first direction (or the X-axis direction). For example, at least one first touch electrode 440_R disposed along the first direction (or the X-axis direction) may be electrically connected to each other by at least one first touch connection electrode to be described below.

At least one first touch block Rx may be spaced apart from each other along a second direction (or a Y-axis direction).

At least one second touch block Tx extends along the second direction (or a Y-axis direction). The second touch block Tx may include at least one second touch electrode 440_T which is disposed to have a predetermined interval.

At least one second touch electrode 440_T may be continuously formed in the second direction (or the Y-axis direction) without being disconnected. For example, at least one second touch electrode 440_T disposed along the second direction (or the Y-axis direction) may be electrically connected to each other by at least one second touch connection electrode 440_C to be described below. Therefore, at least one second touch electrode 440_T disposed along the second direction (or the Y-axis direction) may be electrically connected to each other.

At least one second touch block Tx may be spaced apart from each other along the first direction (or the X-axis direction) with a predetermined interval.

The first touch block Rx and the second touch block Tx are disposed to be spaced apart from each other with a predetermined interval. Therefore, the first touch block Rx and the second touch block Tx are electrically isolated.

According to another exemplary embodiment, the first touch block Rx and the second touch block Tx may have a metal mesh structure. The first touch electrode 440_R of the first touch block Rx and the second touch electrode 440_T of the second touch block Tx may have a metal mesh structure. The first touch block Rx and the second touch block Tx may have a rhombus shaped first touch electrode 440R and second touch electrode 440_T including the metal mesh structure. The metal mesh structure will be described below with reference to FIG. 7. In the present disclosure, even though it has been described that the first touch block Rx extends in the first direction (or the X-axis direction) and the second touch block Tx extends in the second direction (or the Y-axis direction), the first touch block and the second touch block can be switched.

In the non-active area NA of the display apparatus 100, a touch line 450 and a touch driver TDC may be disposed. The touch line 450 includes a first touch line 451 and a second touch line 452.

Each of at least one first touch block Rx and at least one second touch block Tx may be electrically connected to the corresponding touch line 450. Each of at least one first touch block Rx and a plurality of second touch blocks Tx may be connected to the touch driver TDC disposed in a part of the non-active area NA by the touch line 450. Each of the first touch block Rx and the second touch block Tx is connected to the touch driver TDC to transmit or receive signals.

The touch driver TDC is connected to the first touch block Rx and the plurality of second touch blocks Tx to transmit or receive signals. For example, the touch driver TDC may receive a touch sensing signal from the first touch block Rx or the first touch electrode 440_R. Further, the touch driver TDC may transmit a touch driving signal to the second touch block Tx or the second touch electrode 440_T. The touch driver TDC may sense the touch of the user using a mutual capacitance between the first touch block Rx or the plurality of first touch electrodes 440_R and the second touch block Tx or the second touch electrode 440_T. For example, when the touch operation is performed in the display apparatus 100, the capacitance change may be caused between the first touch block Rx or the first touch electrode 440_R and the second touch block Tx or the second touch electrode 440_T. The touch driver TDC may sense the capacitance change to detect a touch coordinate.

Figure 6:
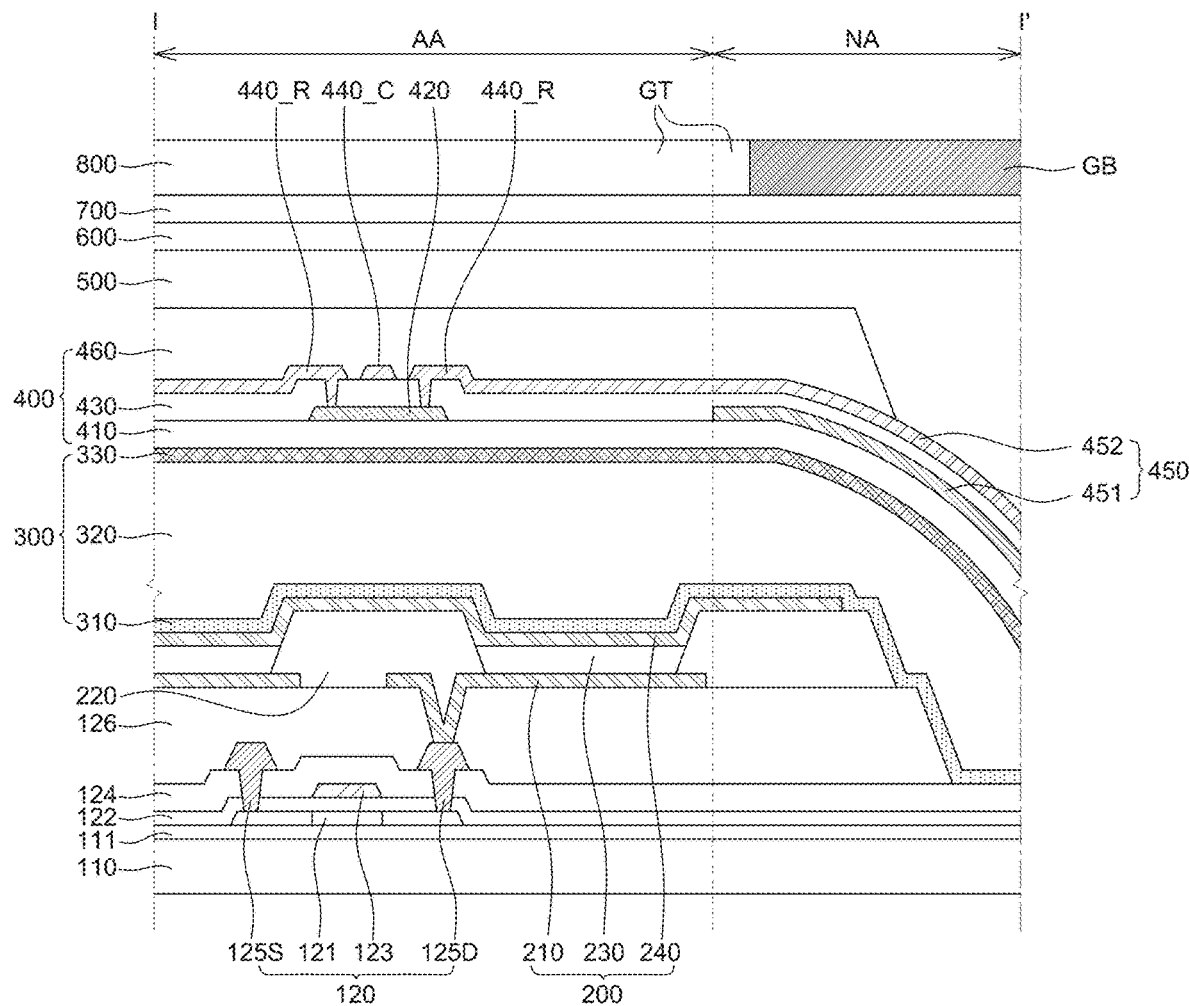
FIG. 6 is a cross-sectional view illustrating a touch sensor layer disposed on a substrate according to an exemplary embodiment of the present disclosure.

FIG. 6 is a cross-sectional view illustrating a touch sensor layer disposed on a substrate according to an exemplary embodiment of the present disclosure. A display apparatus 100 of FIG. 6 is substantially the same as the display apparatus of FIG. 2 except for a display panel DISP so that a redundant description will be omitted.

As illustrated in FIG. 6, the display panel DISP according to the exemplary embodiment of the present disclosure may include a touch sensor layer 400.

A semiconductor layer 121 may be disposed in the active area AA on the substrate 110. The semiconductor layer 121 may be formed of polysilicon (polycrystalline silicon). An amorphous silicon (a-Si) material is deposited on the buffer layer and a dehydrogenation process, a crystallization process, an activation process, and a hydrogenation process are performed to form polysilicon and the polysilicon is patterned to form the semiconductor layer 121. When the semiconductor layer 121 is formed of a polysilicon, the thin film transistor 120 may be an LTPS thin film transistor using a low temperature polysilicon (LTPS). The polysilicon material has a high mobility so that when the semiconductor layer 121 is formed of polysilicon, it is advantageous in that the energy power consumption is low and the reliability is excellent.

Further, the semiconductor layer 121 may be made of amorphous silicon (a-Si) or various organic semiconductor materials such as pentacene. As another example, the semiconductor layer 121 may be made of oxide.

A first insulating layer 122 may be disposed on the semiconductor layer 121. The first insulating layer 122 insulates the gate electrode 123 from the semiconductor layer 121.

The first insulating layer 122 may be formed of an insulating material such as silicon nitride (SiNx) or silicon oxide (SiOx) or other insulating organic material. The first insulating layer 122 may include a hole to electrically connect a source electrode 125S and a drain electrode 125D to the semiconductor layer 121.

The gate electrode 123 may be disposed in the active area AA on the first insulating layer 122 so as to overlap the semiconductor layer 121. The gate electrode 123 may be formed of a single layer or a multi-layer formed of any one of molybdenum (Mo), copper (Cu), titanium (Ti), aluminum (Al), chrome (Cr), gold (Au), nickel (Ni), neodymium (Nd), tungsten (W), and gold (Au) or an alloy thereof, but is not limited thereto.

A second insulating layer 124 may be disposed on the gate electrode 123. The second insulating layer 124 may be formed of an insulating material such as silicon nitride (SiNx) or silicon oxide (SiOx) or other insulating organic material. The second insulating layer 124 may include a hole to electrically connect the source electrode 125S and the drain electrode 125D to the semiconductor layer 121.

The source electrode 125S and the drain electrode 125D may be disposed on the second insulating layer 124.

The source electrode 125S and the drain electrode 125D disposed in the active area AA are electrically connected to the semiconductor layer 121 through the holes of the first insulating layer 122 and the second insulating layer 124.

The source electrode 125S and the drain electrode 125D may be formed of a single layer or a multi-layer formed of any one of molybdenum (Mo), copper (Cu), titanium (Ti), aluminum (Al), chrome (Cr), gold (Au), nickel (Ni), and neodymium (Nd) or an alloy thereof, but is not limited thereto. For example, the source electrode 125S and the drain electrode 125D may be formed by a triple layered structure of titanium (Ti)/aluminum (Al)/titanium (Ti) formed of a conductive metal material.

A connection electrode may be further disposed on the source electrode 125S and the drain electrode 125D. A connection electrode disposed between the drain electrode 125D and the light emitting diode layer 200 transmits the current and the signal of the thin film transistor 120 to the light emitting diode layer 200 via the connection electrode.

A planarization layer 126 may be disposed on the source electrode 125S and the drain electrode 125D. The planarization layer 126 protects the thin film transistor disposed therebelow and relieves or planarizes a step due to various patterns.

The planarization layer 126 may be disposed in the active area AA and a part of the non-active area NA.

The planarization layer 126 may be formed of at least one of an acrylic resin, an epoxy resin, a phenol resin, a polyamide resin, a polyimide resin, a unsaturated polyester resin, a polyphenylene resin, and a polyphenylene sulfide resin, but is not limited thereto.

The planarization layer 126 may include a hole to electrically connect the source electrode 125S or the drain electrode 125D to the anode electrode 210.

The planarization layer 130 may be disposed as a single layer, but may be disposed as two or more layers in consideration of the placement of the electrode. As the display apparatus 100 is implemented with a high resolution, various signal lines are increased so that two or more planarization layers may be configured. Therefore, it is difficult to dispose all wiring lines on one layer with a minimum interval, so that the planarization layer 130 may be configured as an additional layer. A space for disposing the wiring lines is generated by the additional layer so that it is easy to design the wiring line and/or electrode placement. Further, when a dielectric material is used for the planarization layer configured by a plurality of layers, the planarization layer 130 may be utilized to form a capacitance between metal layers.

The anode electrode 210 may be disposed on the planarization layer 126. The anode electrode 210 may be electrically connected to the drain electrode 125D through the hole of the planarization layer 126.

The anode electrode 210 may supply holes to the emission layer 230 and may be formed of a conductive material having a high work function.

When the display apparatus 100 is a top emission type, the anode electrode 210 may be disposed using an opaque conductive material as a reflective electrode which reflects light. For example, the anode electrode 210 may be formed of at least one of silver (Ag), aluminum (Al), gold (Au), molybdenum (Mo), tungsten (W), chrome (Cr), or an alloy thereof, but is not limited thereto.

For example, the anode electrode 210 may be formed with a triple layered structure of silver (Ag)/lead (Pb)/copper (Cu), but is not limited thereto.

A bank layer 220 may be disposed on the anode electrode 210 and the planarization layer 126. The bank layer 220 divides the plurality of sub pixels SP, minimizes or reduces the glaring phenomenon, and suppresses color mixture at various viewing angles.

The bank layer 220 may have a bank hole which exposes the anode electrode 210 corresponding to the emission area.

The bank layer 220 may be formed of at least one of an inorganic insulating material such as silicon nitride (SiNx) or silicon oxide (SiOx) and an organic insulating material such as benzocyclobutene (BCB), an acrylic resin or an imide resin, but is not limited thereto.

A spacer may be further disposed on the bank layer 220. The spacer reduces the likelihood of the display apparatus 100 from being broken due to the external impact by buffering an empty space between the substrate 110 on which the light emitting diode layer 200 is formed and the upper substrate. The spacer may be formed of the same material as the bank layer 220 and simultaneously formed with the bank layer 220, but is not limited thereto.

The emission layer 230 may be disposed on the anode electrode 210 and the bank layer 220. The emission layer 230 is a layer for emitting light having a specific color and includes at least one of a red organic emission layer, a green organic emission layer, a blue organic emission layer, and a white organic emission layer. When the emission layer 230 includes the white organic emission layer, a color filter for converting white light from the white organic emission layer into another color light may be disposed above the light emitting diode layer 200. Further, in addition to the organic emission layer, the emission layer 230 may further include a hole injection layer, a hole transport layer, an electron transport layer, and a electron injection layer, but is not limited thereto.

The cathode electrode 240 may be disposed on the emission layer 230. The cathode electrode 240 supplies electrons to the emission layer 230 and may be formed of a conductive material having a low work function.

When the display apparatus 100 is a top emission type, the cathode electrode 240 may be disposed using a transparent conductive material through which light passes. For example, the cathode electrode may be formed of at least one of indium tin oxide (ITO) and indium zinc oxide (IZO), but is not limited thereto.

Further, the cathode electrode may be disposed using an opaque conductive material through which light passes. For example, the cathode electrode may be formed of at least one of alloys such as LiF/Al, CsF/Al, Mg:Ag, Ca/Ag, Ca:Ag, LiF/Mg:Ag, LiF/Ca/Ag, and LiF/Ca:Ag.

The protection layer 300 may be disposed on the cathode electrode 240 of the light emitting diode layer 200. The protection layer 300 may protect the light emitting diode layer 200 from moisture, oxygen, or foreign materials of the outside. For example, the permeation of the oxygen and moisture from the outside may be suppressed to avoid oxidation of a light emitting material and an electrode material.

The protection layer 300 may be formed of a transparent material to transmit light emitted from the emission layer 230.

The protection layer 300 may include a first protection layer 310, a second protection layer 320, and a third protection layer 330 which block the permeation of moisture or oxygen. The first protection layer 310, the second protection layer 320, and the third protection layer 330 are alternately laminated. The protection layer 300 is formed of a transparent material to transmit light emitted from the emission layer 230.

The first protection layer 310 and the third protection layer 330 are formed of at least one inorganic material among silicon nitride (SiNx), silicon oxide (SiOx), and silicon aluminum (AlyOz), but is not limited thereto. The first protection layer 310 and the third protection layer 330 may be formed using a vacuum film forming method such as chemical vapor deposition (CVD) or atomic layer deposition (ALD), but are not limited thereto.

The second protection layer 320 may cover foreign materials or particles which may be generated during a manufacturing process. Further, the second protection layer 320 may planarize a surface of the first protection layer 310. For example, the second protection layer 320 may be a particle cover layer, but is not limited to the terminology.

The second protection layer 320 may be an organic material, for example, a polymer such as silicon oxy carbon (SiOCz), epoxy, polyimide, polyethylene, or acrylate, but is not limited thereto.

The second protection layer 320 may be formed of a thermosetting material or a photo curable material which is hardened by heat or light.

The touch sensor layer 400 may be disposed on the protection layer 300. The touch sensor layer will be described with reference to FIGS. 7 and 8.

The touch sensor layer 400 includes a first touch electrode 440_R and a second touch electrode 440_T, a first touch connection electrode 420, a second touch connection electrode 440_C, a first touch line 451, and a second touch line 452.

A touch buffer layer 410 may be disposed on the protection layer 300. The touch buffer layer 410 may block a liquid chemical (developer or etchant) used during the process of manufacturing a touch sensor layer 400 or moisture from the outside from being permeated into the light emitting diode layer 200 including an organic material. Further, the touch buffer layer 410 may suppress the disconnection of the plurality of touch sensor metals disposed thereabove due to the external impact. The touch buffer layer 410 may be a buffer layer, but is not limited by the terminology.

The touch buffer layer 410 may be formed of a single layer or multiple layers formed of any one of silicon oxide SiOx or silicon nitride (SiNx) or an alloy thereof, but is not limited thereto. Alternatively, the touch buffer layer 410 may be formed of acrylic, epoxy, or siloxane based material, but it is not limited thereto.

Hereinafter, components formed in an active area AA and a non-active area NA will be described.

The first touch connection electrode 420 may be disposed in the active area AA on the touch buffer layer 410.

The first touch connection electrode 420 disposed in the active area AA may be disposed between the first touch electrodes 440_R adjacent in the first direction (or the X-axis direction). The first touch connection electrode 420 electrically connects the plurality of first touch electrodes 440_R which is spaced apart in the first direction (or the X-axis direction) to be adjacent.

The first touch connection electrode 420 may be disposed so as to overlap the second touch connection electrode 440_C which connects the second touch electrodes 440_T adjacent in the second direction (or the Y-axis direction). The first touch connection electrode 420 and the second touch connection electrode 440_C are formed on different layers to be electrically insulated.

A third insulating layer 430 may be disposed on the touch buffer layer 410 and the first touch connection electrode 420. The third insulating layer 430 may be formed in the active area AA and the non-active area NA. The third insulating layer 430 may be a touch insulating layer or an insulating layer, but is not limited by the terminology.

The third insulating layer 430 may electrically insulate the first touch connection electrode 420 from the second touch electrode 440_T and the second touch connection electrode 440_C.

The third insulating layer 430 may include a hole to electrically connect the first touch electrode 440_R and the first touch connection electrode 420.

The third insulating layer 430 may be formed by a single layer of silicon nitride (SiNx) or silicon oxide (SiOx) or a multilayer thereof, but is not limited thereto.

The first touch electrode 440_R, the second touch electrode 440_T, and the second touch connection electrode 440_C may be disposed in the active area AA on the third insulating layer 430.

The first touch electrode 440_R and the second touch electrode 440_T may be disposed to be spaced apart from each other with a predetermined interval. At least one first touch electrode 440_R adjacent in the first direction (or the X-axis direction) may be formed to be spaced apart from each other. At least one first touch electrode 440_R adjacent to each other in the first direction (or the X-axis direction) may be connected to the first touch connection electrode 420 disposed between the first touch electrodes 440_R. For example, each of the first touch electrodes 440_R may be connected to the first touch connection electrodes 420 by means of the hole of the third insulating layer 430. The second touch electrode 440_T adjacent in the second direction (or the Y-axis direction) may be connected by the second touch connection electrode 440_C. The second touch electrode 440_T and the second touch connection electrode 440_C may be formed on the same layer.

A touch planarization layer 460 may be disposed on the third insulating layer 430, the first touch electrode 440_R, the second touch electrode 440_T, and the second touch connection electrode 440_C.

The touch planarization layer 460 may be disposed so as to cover the third insulating layer 430, the first touch electrode 440_R, the second touch electrode 440_T, and the second touch connection electrode 440_C.

The touch planarization layer 460 may be formed of at least one of an acrylic resin, an epoxy resin, a phenol resin, a polyamide resin, a polyimide resin, a unsaturated polyester resin, a polyphenylene resin, and a polyphenylene sulfide resin, but is not limited thereto.

The first touch electrode 440_R, the second touch electrode 440_T, and the second touch connection electrode 440_C may be formed by the same process.

A touch line 450 may be disposed in the non-active area NA on the touch buffer layer 410. The touch line 450 includes a first touch line 451 and a second touch line 452.

The touch line 450 may be disposed as a double line of the first touch line 451 and the second touch line 452.

The first touch line 451 may be disposed on the touch buffer layer 410. The first touch line 451 may be electrically connected to the second touch line 452 so as to stably supply a signal even though the second touch line 452 is disconnected by the external impact and reduce a resistance of the second touch line 452 which transmits a signal of the touch driver TDC to the first touch block Rx and the second touch block Tx. For example, the first touch line 451 may be electrically connected to the second touch line 452 by means of the hole of the third insulating layer 430.

The third insulating layer 430 may be disposed on the first touch line 451. When the third insulating layer 430 is formed on the first touch connection electrode 420 disposed in the active area AA, the third insulating layer 430 may be simultaneously formed of the same material by the same process, but it is not necessarily limited thereto. Therefore, the third insulating layer may be formed by performing a separate process during the process and the patterning.

The third insulating layer 430 may further include a plurality of holes which exposes at least a part of the first touch line 451.

The first touch line 451 disposed below the third insulating layer 430 and the second touch line 452 disposed above the third insulating layer 430 may be electrically connected by means of the hole of the third insulating layer 430.

The second touch line 452 may be disposed on the third insulating layer 430. The second touch line 452 may transmit a signal (or a voltage) from an external module which is attached or bonded to the touch driver TDC to the first touch block Rx and the second touch block Tx.

The second touch line 452 may be formed of the same material and by the same process as the first touch electrode 440_R, the second touch electrode 440_T, and the second touch connection electrode 440_C disposed in the active area AA, but is not limited thereto.

The touch planarization layer 460 may be disposed on the second touch line 452. The touch planarization layer 460 may be disposed to cover the second touch line 452. The touch planarization layer 460 may planarize an upper portion of the second touch line 452.

The touch planarization layer 460 may be formed of the same material and by the same process as the touch planarization layer disposed in the active area AA, but is not limited thereto.

At least a part of at least one of the first touch line 451 and the second touch line 452 may be disposed to overlap.

The front member 800 may be disposed on the display panel DISP. The front member 800 may include a transmissive part GT and a blocking part GB.

A part of the first touch line 451 and the second touch line 452, of the first touch line 451 and the second touch line 452 disposed in the non-active area NA, which is adjacent to the active area AA may overlap the transmissive part GT of the front member 800. A part of the first touch line 451 and the second touch line 452, of the first touch line 451 and the second touch line 452 disposed in the non-active area NA, which is adjacent to the active area AA may not overlap the blocking part GB of the front member 800.

Accordingly, a part of the first touch line 451 and the second touch line 452, of the first touch line 451 and the second touch line 452 disposed in the non-active area NA, which is adjacent to the active area AA may be exposed to the external light.

Hereinafter, the touch electrode disposed in the active area and the touch line disposed in the non-active area will be described.

Figure 7:
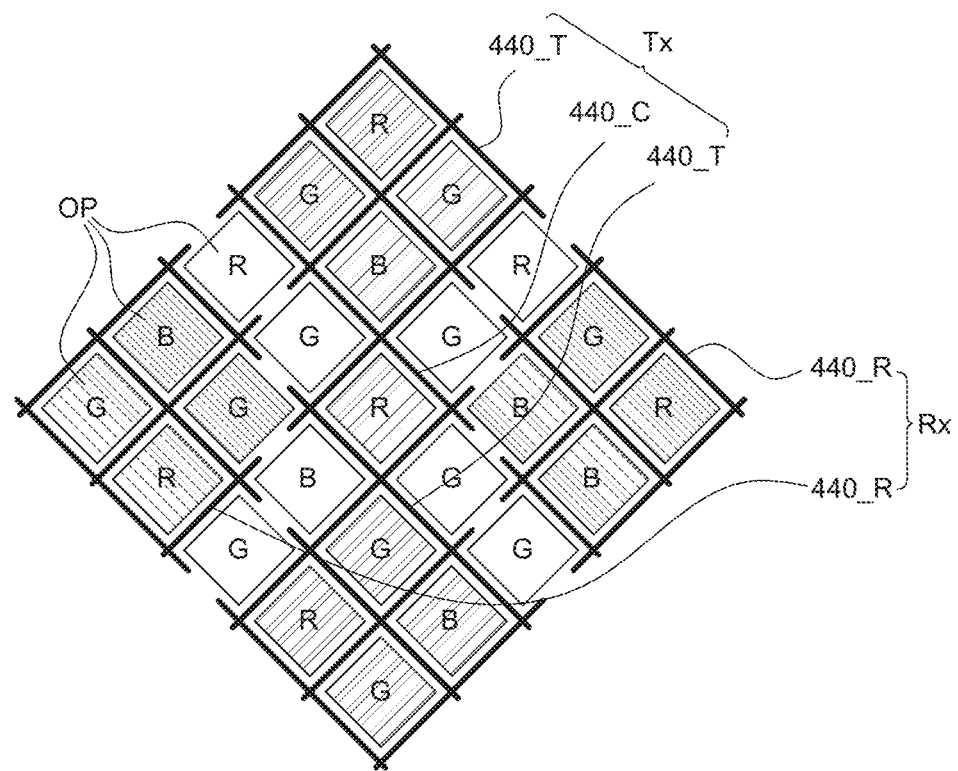
FIG. 7 is an enlarged plan view of a part of an active area of a display apparatus of FIG. 5.

FIG. 7 is an enlarged plan view of a part of an active area of a display apparatus of FIG. 5. FIG. 7 is an enlarged plan view of a part A of a touch electrode disposed in the active area of FIG. 5.

As shown in FIG. 7, the first touch electrode 440_R, the second touch electrode 440_T, the first touch connection electrode 420, and the second touch connection electrode 440_C disposed in the active area AA may be formed with a mesh pattern in which metal lines having a small line width intersect each other. The mesh pattern may have a rhombus shape and a shape of the mesh pattern may be a rectangle, a pentagon, a hexagon shape, a circle, or an oval, but is not limited thereto.

The first touch electrode 440_R, the second touch electrode 440_T, the first touch connection electrode 420, and the second touch connection electrode 440_C may be disposed using an opaque conductive material having a low resistance. For example, the first touch electrode 440_R, the second touch electrode 440_T, the first touch connection electrode 420, and the second touch connection electrode 440_C may have a single layer or a multiple-layered structure formed of a metal material such as molybdenum (Mo), silver (Ag), titanium (Ti), copper (Cu), aluminum (Al), titanium/aluminum/titanium (Ti/Al/Ti), and molybdenum/aluminum/molybdenum (Mo/Al/Mo). However, it is not limited thereto.

An opening OP may be formed in the mesh pattern of the first touch electrode 440_R and the second touch electrode 440_T. The opening OP may correspond to the sub pixel SP. For example, the light emitting diode layer 200 may be disposed in the opening OP.

The first touch electrode 440_R, the second touch electrode 440_T, the first touch connection electrode 420, and the second touch connection electrode 440_C do not overlap red (R), green (G), and blue (B) light emission areas, but overlap the bank layer 220 formed in the non-emission area. Therefore, even though the electrodes are formed of the opaque conductive material, the degradation of the aperture ratio and the transmittance may be suppressed.

Figure 8:
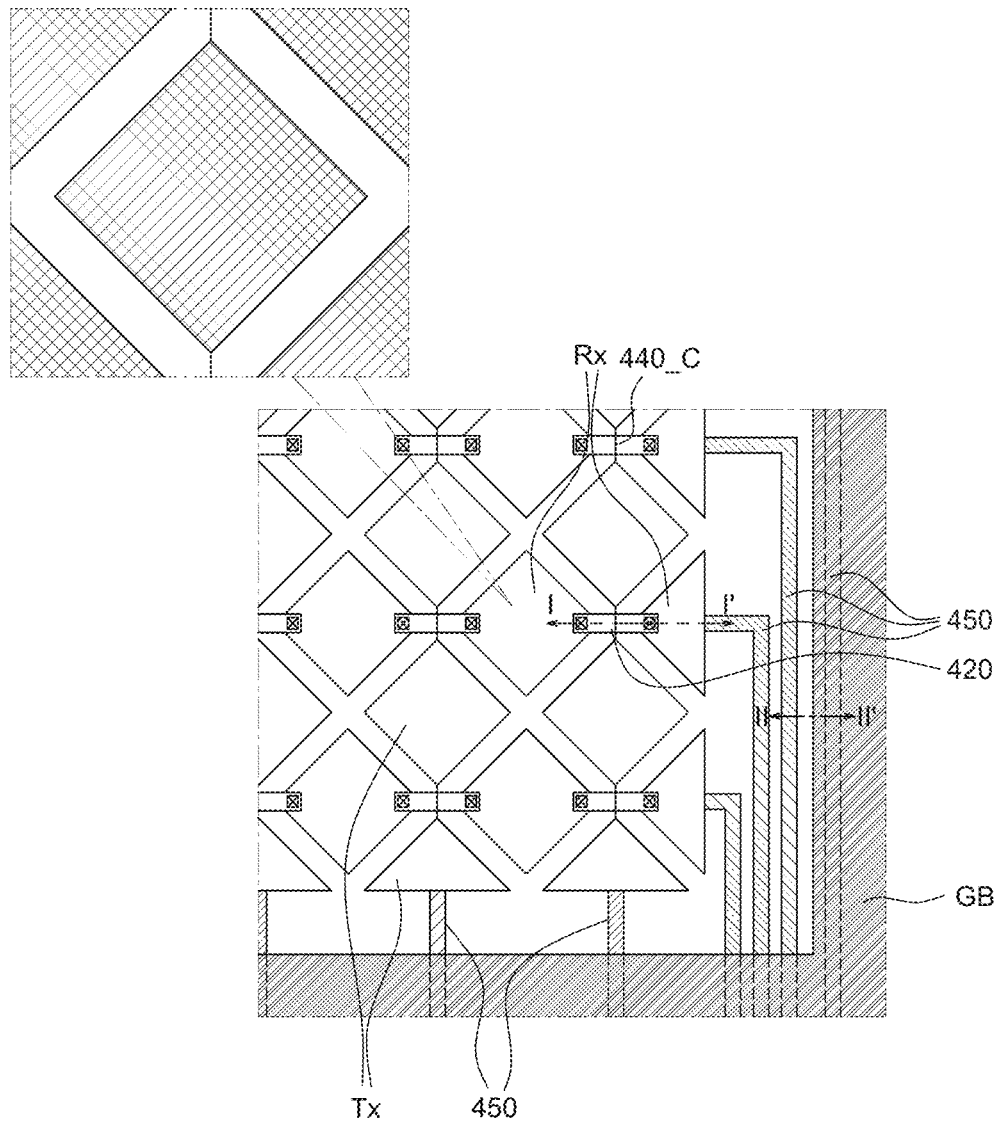
FIG. 8 is an enlarged plan view of a part of an outer peripheral area of a display apparatus of FIG. 7.

FIG. 8 is an enlarged plan view of a part of an outer peripheral area of a display apparatus of FIG. 5. FIG. 8 is an enlarged plan view of a part B of the touch electrode and the touch line in an outer peripheral area of FIG. 5.

With reference to FIG. 8, at least one touch line 450 disposed in the non-active area NA electrically connects the touch driver TDC to the first touch block Rx and the second touch block Tx in order to transmit a signal of the touch driver TDC to the first touch block Rx and the second touch block Tx. In order to transmit the signal of the touch driver TDC disposed in a part of the non-active area NA to the first touch block Rx and the second touch block Tx, a number of touch lines and a length of the touch line may be increased. By doing this, there may be a problem in that the resistance of the touch line is increased or RC delay is increased. When the resistance of the touch line is increased or the RC delay is increased, there may be signal delay to transmit the signal of the touch driver TDC to the touch block so that there may be a problem in that when the user touches the display apparatus, the response speed is slow.

Therefore, the touch line needs to be designed to have a thickness having a line width larger than the line width of the touch electrode disposed in the active area AA to solve the problem in that the resistance of the touch line is increased or the RC delay is increased. For example, the touch line 450 disposed in the non-active area NA has a line width larger than the first touch electrode 440_R and the second touch electrode 440_T disposed in the active area AA.

As shown in FIG. 8, the blocking part GB of the front member 800 may be disposed in a part of the non-active area NA. Accordingly, the blocking part GB of the front member 800 overlaps a part of the touch line 450 and blocks the external light from being incident into the non-active area or suppresses recognition of the components, such as a metal line and a driving circuit, disposed below the front member 800, to the user.

The transmissive part GT of the front member 800 may be disposed in the active area AA and the non-active area NA. For example, in order to suppress the misalignment problem in that the blocking part GB of the front member 800 partially overlaps a part of the active area AA during the bonding process of the substrate 100 and the front member 800, the front member 800 may include the transmissive part GT in a part of the non-active area NA adjacent to the active area AA of the substrate 110. Accordingly, the transmissive part GT of the front member 800 overlaps a part of the touch line 450 and a part of the touch line 450 may be exposed to the outside of the display apparatus 100 by the transmissive part GB of the front member 800.

When the display apparatus 100 does not operate, the external light may be incident into the display apparatus. The external light incident into the display apparatus 100 may be reflected by various metal electrodes and wiring lines disposed in the display apparatus 100.

When the display apparatus 100 operates, the luminance is increased by light emitted from the light emitting diode layer 200 of the display apparatus 100 so that there is no contrast ratio difference in the display apparatus 100. However, when the display apparatus 100 does not operate, there is a problem in that non-uniform contrast ratio of the display apparatus 100 due to the external light is perceived by the user.

Light which is reflected by the metal electrode and the wiring line formed in the display apparatus 100 may be transmitted to the outside by means of the transparent transmissive part GT of the front member 800 through which the light is transmitted. When the reflected light is transmitted, the reflected light is blocked by the touch electrode and the touch line disposed above the display apparatus 100 to be hardly transmitted to the outside of the display apparatus 100. For example, incident light is reflected by the metal electrode and the wiring line of the thin film transistor 120 or the emission display layer 200 formed below the display apparatus 100 to be transmitted to the outside of the display apparatus 100. However, the reflected light may not be transmitted to the outside of the display apparatus in an area in which the touch line 450 is disposed to be thick with a predetermined thickness.

The touch line 450 disposed in the non-active area NA is formed to be thicker than the touch electrode disposed in the active area AA so that in the touch line which is not blocked by the blocking part GB of the front member 800, an amount of reflected light which is transmitted to the outside may be smaller than that of the surrounding area. Accordingly, when the display apparatus 100 does not operate, a part where the touch line which is not blocked by the blocking part GB of the front member 800 is formed is recognized to be darker than the surrounding area.

When the display apparatus 100 does not operate, a part of the display apparatus 100 is formed to have different contrast ratios to the users so that a display apparatus having a degraded aesthetic sense may be provided to the user.

Accordingly, in the display apparatus 100 according to the exemplary embodiment of the present disclosure, the touch line disposed in an area overlapping the transmissive part GT of the front member 800 in the non-active area NA may include a pattern. The touch line disposed in an area which does not overlap the blocking part GB of the front member 800 in the non-active area NA may include a pattern. By doing this, a non-uniform contrast ratio of the display apparatus which is visible to the user when the display apparatus does not operate may be improved.

Hereinafter, a pattern of a touch line disposed in a non-active area NA according to an exemplary embodiment of the present disclosure will be described with reference to FIGS. 9 and 10.

Figure 9:
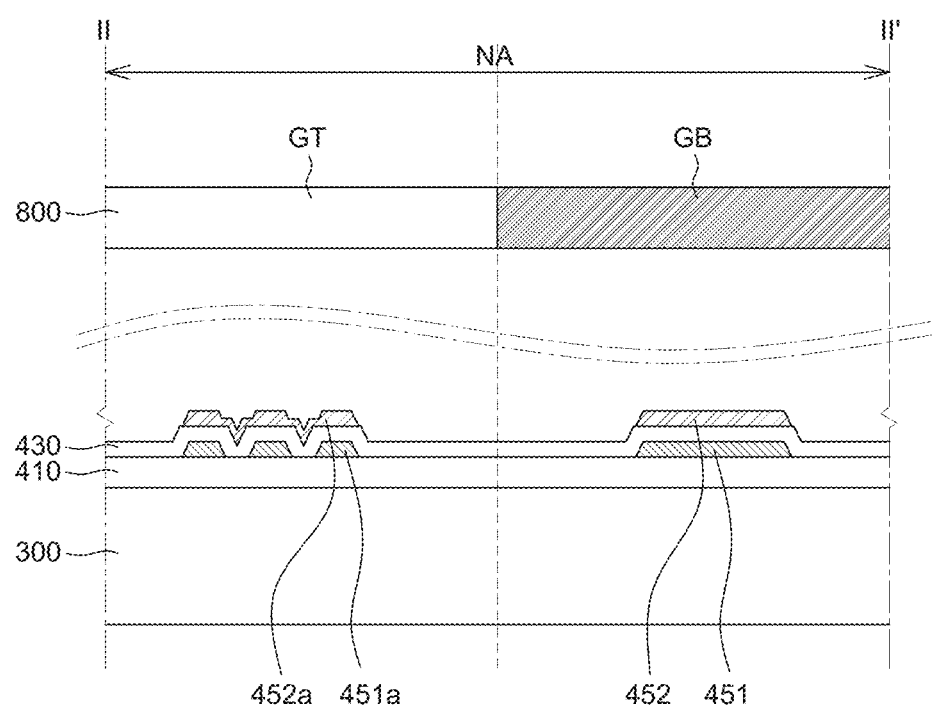
FIG. 9 is an enlarged cross-sectional view of a part of a touch line disposed in a non-active area of FIG. 8.

FIG. 9 is an enlarged cross-sectional view of a part of a touch line disposed in a non-active area of FIG. 8. FIG. 9 is a cross-sectional view taken along II-II' of FIG. 8. FIG. 10 is a plan view of a first touch line according to an exemplary embodiment of the present disclosure.

Figure 10:
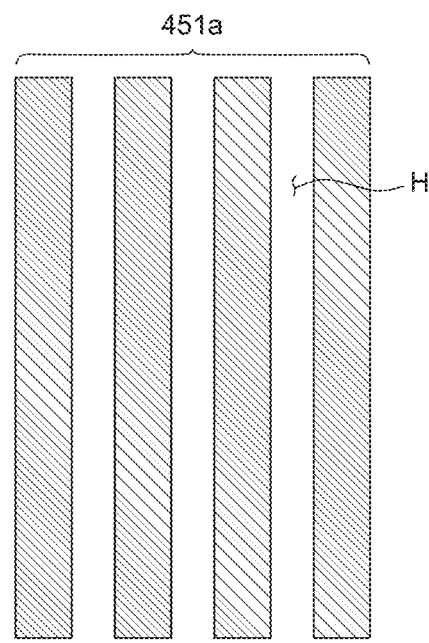
FIG. 10 is a plan view of a touch line according to an exemplary embodiment of the present disclosure.

With reference to FIGS. 9 and 10, the display apparatus 100 according to the exemplary embodiment of the present disclosure includes a first touch line 451 having a pattern 451a and a second touch line 452a having a step in a part of the non-active area NA.

The pattern 41a of the first touch line 451 may scatter incident light entering into the display apparatus 100 to increase an amount of light which is transmitted to the outside of the display apparatus 100.

After forming the pattern 451a of the first touch line 451, the third insulating layer 430 and a second touch line 452a may be formed. The third insulating layer 430 and the second touch line 452a formed above the pattern 451a of the first touch line 451 may have a plurality of steps or curves due to the pattern 451a of the first touch line 451.

When the display apparatus 100 does not operate, the external light may be incident into the display apparatus 100 by means of the transmissive part GT of the front member 800. When the external light which is incident into the display apparatus 100 is incident into an area where the steps or curves of the second touch line 42a are formed by the pattern 451a of the first touch line 451, an amount of reflected light is increased by the second touch line 452a. For example, light which is incident into the second touch line 452a is scattered by the step of the second touch line 452a so that increased light is emitted to the outside of the display apparatus 100.

The first touch line 451 disposed in the transmissive part GT of the front member 800 may include a pattern including at least two steps. Alternatively, the first touch line 451 may include at least one hole H.

As illustrated in FIG. 10, the hole H of the first touch line 451 is formed along the second direction (or the Y-axis direction).

Patterns 451a of the first touch line 451 may be at least partially spaced apart from each other by at least one hole H formed in the first touch line 451. At least two patterns 451a of the first touch line 451 disposed in an area overlapping the transmissive part GT of the front member 800 are electrically connected to transmit or receive the same signal from the touch driver TDC to or from the touch block of the active area AA.

Each of the patterns 451a of at least two first touch lines 451 disposed in the area overlapping the transmissive part GT of the front member 800 may have a thickness smaller than that of the first touch line 451 disposed in an area overlapping the blocking part GB of the front member 800. For example, the first touch lines 451 formed in the transmissive part GT and the blocking part BT have the same line width and the first touch line 451 formed in the transmissive part GT further includes a hole H. Therefore, a line width of the pattern 451a of the first touch line 451 formed in the transmissive part GT may be smaller than a line width of the first touch line formed in the blocking part GB.

The third insulating layer 430 and the second touch line 452 may be disposed on the first touch line 451.

The second touch line 452a disposed in an area overlapping the transmissive part GT of the front member 800 may have a step or a curve by the first touch line 451 formed below the second touch line 452a.

External light incident into the display apparatus 100 which is transmitted to the outside of the display apparatus 100 is increased by the step or the curve of the second touch line 452a.

For example, when the display apparatus 100 does not operate, some of external light incident into the display apparatus 100 is incident into the second touch line 452a disposed in the non-active area NA by means of the transmissive part GT of the front member 800.

The second touch line 452a includes a plurality of upper surfaces and side surfaces and incident light incident into the upper surfaces and the side surfaces of the second touch line 452a are scattered onto the upper surfaces and the side surfaces of the second touch line 452a so that an amount of light is increased. Light increased by the second touch line 452a is emitted to the outside of the display apparatus 100.

By doing this, when the user watches the display apparatus 100, a contrast ratio difference in the transmissive part GT of the front member 800 disposed in the non-active area NA is minimized or reduced. Further, the problem in that a contrast is recognized to be dark in the area which is not blocked by the blocking part GB of the front member 800 is improved and the contrast is formed to be uniform with the surrounding area so that a high aesthetic sense may be provided to the user.

The second touch lines 452a and 452 may transmit a signal (or a voltage) from an external module which is bonded to the touch driver TDC to the first touch block Rx and the second touch block Tx disposed in the active area AA. Accordingly, the second touch lines 452a and 452 according to another exemplary embodiment may not include a predetermined pattern or hole to block the problem in that the resistance of the wiring line is increased or the RS delay is increased.

Figure 11:
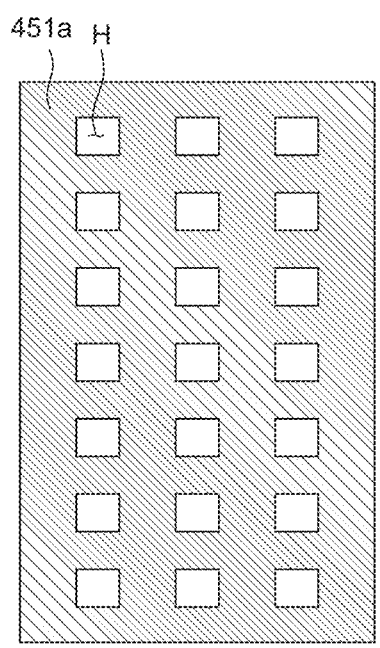
FIG. 11 is a plan view of a touch line according to another exemplary embodiment of the present disclosure.

FIG. 11 is a plan view of a touch line according to another exemplary embodiment of the present disclosure As illustrated in FIG. 11, the first touch line 451 may have a mesh type pattern 451a. The first touch line 451 according to the exemplary embodiment includes at least two patterns 451a and at least one hole H and the type of the first touch line 451 of FIGS. 10 and 11 is illustrative, but is not limited thereto.

Figure 12A:
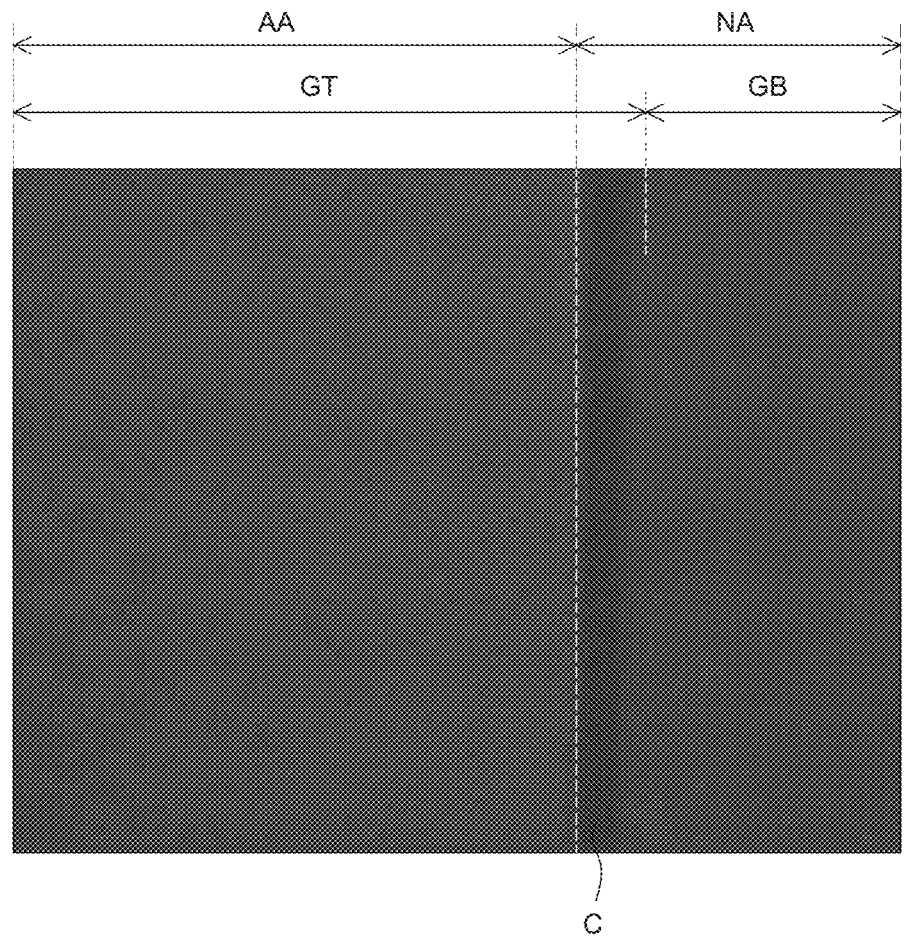
FIG. 12A is an optical micrograph of a display apparatus including a touch line in which a pattern is not formed according to an experimental example.
Figure 12B:
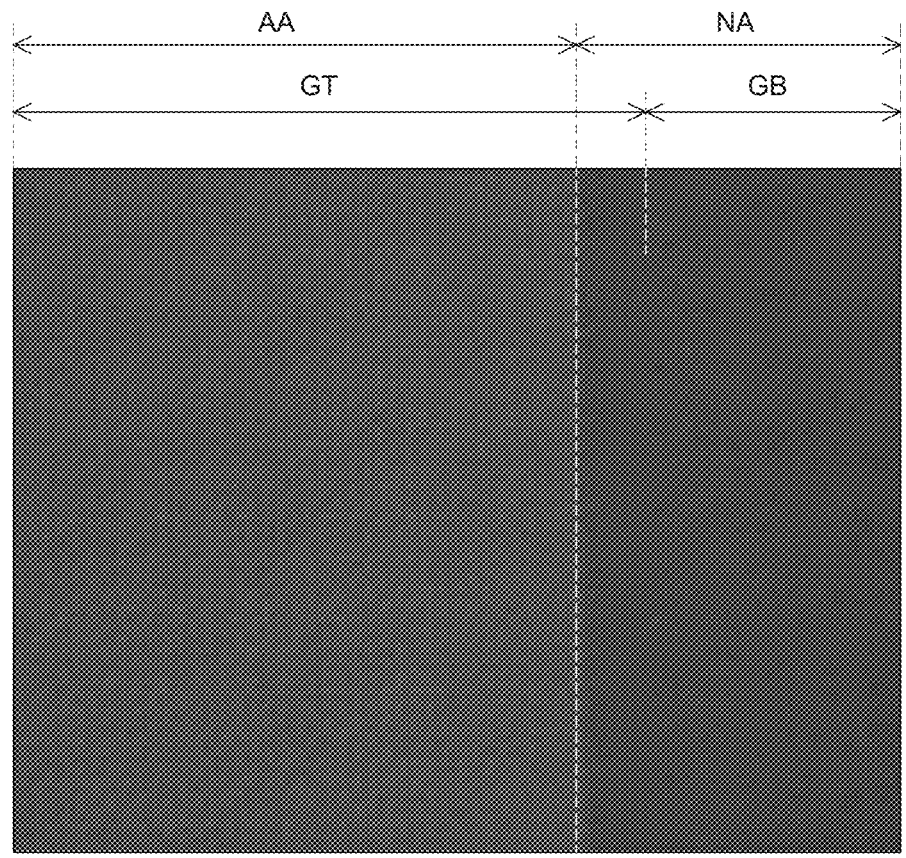
FIG. 12B is an optical micrograph of a display apparatus including a touch line in which a pattern is formed according to an exemplary embodiment of the present disclosure.

FIG. 12A is an optical micrograph of a display apparatus including a touch line in which a pattern is not formed according to an experimental example and FIG. 12B is an optical micrograph of a display apparatus including a touch line in which a pattern is formed according to an exemplary embodiment of the present disclosure.

With reference to FIGS. 12A and 12B, when the display apparatus 100 does not operate, parts of the active area AA and the non-active area NA of the display apparatus 100 are captured using an optical microscope. In a display apparatus in which the pattern is not formed in the first touch line 451, it is confirmed that a part of the non-active area NA adjacent to the active area AA has a non-uniform contrast ratio C. For example, a part of the non-active area NA which is not blocked by the blocking part GB of the front member 800 looked darker than the surrounding area. Alternatively, a part of the non-active area NA which is exposed by the transmissive part GT of the front member 800 looked darker than the surrounding area.

As shown in FIG. 12B, in the display apparatus in which the pattern 451a is formed in the first touch line 451, it is confirmed that the non-uniform contrast ratio recognized by the user is minimized or reduced.

Accordingly, a pattern is configured in the first touch line 451 so that when the apparatus does not operate, the uniform contrast ratio is provided, thereby providing a display apparatus with an improved reliability of the product.

Further, the pattern is configured in the first touch line 451 so that the non-uniform contrast ratio is minimized or reduced so as not to be exposed to the sight of the users, thereby uniformly forming the contrast ratio of the display apparatus which is recognized by the users to provide a high aesthetic sense to the users.

Exemplary embodiments of the present disclosure can also be described as follows:

According to an aspect of the present disclosure, a display apparatus may include a substrate having an active area and a non-active area adjacent to the active area defined thereon; a first touch line in the non-active area and a second touch line on the first touch line; and a front member on the first and second touch lines, the front member being in at least a part of the non-active area, and including a transmissive part and a blocking part, wherein the first touch line is in an area overlapping the transmissive part, and the first touch lines includes at least two patterns.

The at least two patterns may each define steps.

The at least two patterns of the first touch line may each define a step from a lower surface of the respective one of the at least two patterns to an upper surface of the respective one of the at least two patterns.

The at least two patterns may each include at least one hole.

The at least two patterns may be electrically connected to each other.

Each of the at least two patterns may at least partially spaced apart from each other.

Each of the at least two patterns may have a smaller width than the first touch line in the area overlapping the blocking part.

The first touch line may include a mesh shape.

The second touch line in the transmissive part of the non-active area may include an uneven lower surface.

First portions of the lower surface between adjacent ones of the at least two patterns may lower than second portions of the lower surface over respective ones of the at least two patterns.

The transmissive part of the front member may be in an adjacent part of the active area.

The display apparatus may further comprise a first touch connection electrode disposed on a substrate of the active area; a third insulating layer disposed on the first touch connection electrode; and a first touch electrode and a second touch electrode disposed on the third insulating layer.

The first touch electrode and the second touch electrode may sense the presence of touch and a touch position by sensing a variation of a mutual capacitance between the first touch electrode and the second touch electrode.

The first touch line may be formed by a same process as the first touch electrode.

The second touch line may be formed by a same process as the second touch electrode.

The first touch line and the second touch line may be electrically connected to each other.

The first touch line which is in an area overlapping the blocking part may include at least two patterns.

The display apparatus may further comprise a thin film transistor disposed on a substrate in which the active area and the non-active area are formed; a light emitting diode layer disposed on the thin film transistor; and a protection layer disposed on the light emitting diode layer, wherein the first touch line and the second touch line are disposed on the protection layer.

According to another aspect of the present disclosure, a display apparatus may comprises a substrate that having an active area and a non-active area adjacent to the active area defined thereon; a first touch electrode in the active area; a second touch electrode on the first touch electrode; a first touch line in the non-active area; a second touch line on the first touch line; and a front member on the first touch electrode, the second touch electrode, the first touch line, and the second touch line, the front member being in at least a part of the non-active area, and including a transmissive part and a blocking part, wherein the first touch line is in an area overlapping the transmissive part in at least a part of the non-active area, and the first touch line includes at least two patterns.

The second touch line in the transmissive part of the non-active area may include an uneven lower surface.

First portions of the lower surface between adjacent ones of the at least two patterns may be lower than second portions of the lower surface over respective ones of the at least two patterns.

The at least two patterns may each include at least one hole.

A width of at least one of the first touch electrode and the second touch electrode may be smaller than a width of at least one of the first touch line and the second touch line.

According to another aspect of the present disclosure, a display apparatus may comprise a substrate having an active area and a non-active area adjacent to the active area defined thereon; a first touch line in the non-active area and a second touch line on the first touch line; and a front member on the first and second touch lines, the front member being in at least a part of the non-active area, and including a transmissive part and a blocking part, wherein the second touch line in the transmissive part of the non-active area includes an uneven lower surface.

The first touch line may include at least two patterns.

First portions of the lower surface between adjacent ones of the at least two patterns may be lower than second portions of the lower surface over respective ones of the at least two patterns.

Each of the at least two patterns may be spaced apart from each of the other ones of the at least two patterns.

The at least two patterns may be substantially parallel with each other in the area overlapping the transmissive part.

It will be apparent to those skilled in the art that various modifications and variations can be made in the display apparatus of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display apparatus, comprising:
a substrate having an active area and a non-active area adjacent to the active area defined thereon;
a first touch line in the non-active area and a second touch line on the first touch line; and
a front member on the first and second touch lines, the front member being in at least a part of the non-active area, and including a transmissive part and a blocking part,
wherein at least a portion of the first touch line is in an area overlapping the transmissive part, and the first touch lines includes at least two patterns, and
wherein each of the at least two patterns has a smaller width than the first touch line in the area overlapping the blocking part.

2. The display apparatus according to claim 1, wherein the at least two patterns each define steps.

3. The display apparatus according to claim 2, wherein the at least two patterns of the first touch line each define a step from a lower surface of the respective one of the at least two patterns to an upper surface of the respective one of the at least two patterns.

4. The display apparatus according to claim 1, wherein the at least two patterns each include at least one hole.

5. The display apparatus according to claim 1, wherein the at least two patterns are electrically connected to each other.

6. The display apparatus according to claim 1, wherein each of the at least two patterns is at least partially spaced apart from each other.

7. The display apparatus according to claim 1, wherein the first touch line includes a mesh shape.

8. The display apparatus according to claim 1, wherein the second touch line in the transmissive part of the non-active area includes an uneven lower surface.

9. The display apparatus according to claim 8, wherein first portions of the lower surface between adjacent ones of the at least two patterns are lower than second portions of the lower surface over respective ones of the at least two patterns.

10. The display apparatus according to claim 1, wherein the transmissive part of the front member is in an adjacent part of the active area.

11. The display apparatus according to claim 1, further comprising:
a first touch connection electrode disposed on a substrate of the active area;
a third insulating layer disposed on the first touch connection electrode; and
a first touch electrode and a second touch electrode disposed on the third insulating layer.

12. The display apparatus according to claim 11, wherein the first touch electrode and the second touch electrode sense the presence of touch and a touch position by sensing a variation of a mutual capacitance between the first touch electrode and the second touch electrode.

13. The display apparatus according to claim 11, wherein the first touch line is formed by a same process as the first touch electrode.

14. The display apparatus according to claim 11, wherein the second touch line is formed by a same process as the second touch electrode.

15. The display apparatus according to claim 1, wherein the first touch line and the second touch line are electrically connected to each other.

16. The display apparatus according to claim 1, wherein the first touch line which is in an area overlapping the blocking part includes at least two patterns.

17. The display apparatus according to claim 1, further comprising:
a thin film transistor disposed on a substrate in which the active area and the non-active area are formed;
a light emitting diode layer disposed on the thin film transistor; and
a protection layer disposed on the light emitting diode layer,
wherein the first touch line and the second touch line are disposed on the protection layer.

18. A display apparatus, comprising:
a substrate that having an active area and a non-active area adjacent to the active area defined thereon;
a first touch electrode in the active area;
a second touch electrode on the first touch electrode;
a first touch line in the non-active area;
a second touch line on the first touch line; and
a front member on the first touch electrode, the second touch electrode, the first touch line, and the second touch line, the front member being in at least a part of the non-active area, and including a transmissive part and a blocking part,
wherein at least a portion of the first touch line is in an area overlapping the transmissive part in at least a part of the non-active area, and the first touch line includes at least two patterns,
wherein the second touch line in the transmissive part of the non-active area includes an uneven lower surface, and
wherein first portions of the lower surface between adjacent ones of the at least two patterns are lower than second portions of the lower surface over respective ones of the at least two patterns.

19. The display apparatus according to claim 18, wherein the at least two patterns each include at least one hole.

20. The display apparatus according to claim 18, wherein a width of at least one of the first touch electrode and the second touch electrode is smaller than a width of at least one of the first touch line and the second touch line.

21. A display apparatus, comprising:
a substrate having an active area and a non-active area adjacent to the active area defined thereon;
a first touch line in the non-active area and a second touch line on the first touch line; and
a front member on the first and second touch lines, the front member being in at least a part of the non-active area, and including a transmissive part and a blocking part,
wherein the second touch line in the transmissive part of the non-active area includes an uneven lower surface,
wherein the first touch line includes at least two patterns, and
wherein the at least two patterns are substantially parallel with each other in the area overlapping the transmissive part.

22. The display apparatus according to claim 21, wherein first portions of the lower surface between adjacent ones of the at least two patterns are lower than second portions of the lower surface over respective ones of the at least two patterns.

23. The display apparatus according to claim 21, wherein each of the at least two patterns is spaced apart from each of the other ones of the at least two patterns.

* * * * *